United States Patent [19]
Merchant et al.

[11] Patent Number: 5,902,504
[45] Date of Patent: May 11, 1999

[54] SYSTEMS AND METHODS FOR DETERMINING SEMICONDUCTOR WAFER TEMPERATURE AND CALIBRATING A VAPOR DEPOSITION DEVICE

[75] Inventors: Sailesh Mansinh Merchant; Binh Nguyenphu, both of Orlando, Fla.

[73] Assignee: Lucent Technologies Inc., Murray Hill, N.J.

[21] Appl. No.: 08/834,261

[22] Filed: Apr. 15, 1997

[51] Int. Cl.$^6$ ...................................................... H05B 1/02
[52] U.S. Cl. .............................. 219/497; 219/505; 374/1; 374/178; 437/248
[58] Field of Search .................................... 219/497, 499, 219/501, 504, 505, 121.43, 121.59; 156/345; 118/723, 725, 712; 374/55, 120, 1, 137, 178, 162; 324/158.1

[56] References Cited

U.S. PATENT DOCUMENTS

| | | | |
|---|---|---|---|
| 3,634,151 | 1/1972 | Sato et al. | 148/178 |
| 4,739,258 | 4/1988 | Schwarz | 324/158 R |
| 4,891,497 | 1/1990 | Yoshimura | 219/241 |
| 5,232,509 | 8/1993 | Min et al. | 118/723 |
| 5,350,899 | 9/1994 | Ishikawa et al. | 219/494 |
| 5,718,511 | 2/1998 | Mundt | 374/137 |
| 5,769,540 | 6/1998 | Schietinger et al. | 374/127 |

OTHER PUBLICATIONS

Publication entitled Thin Film Interactions of Al and Al(Cu) On W and Tl; Electrochemical Society; Extend Abstracts; vol. 83–1; 1983, p. 681.

Publication entitled "Effect of Si on the Reaction Kinetics of Ti/AlSi Bilayer Structures" by R.K. Nahar and N.M. Devashrayee; Appl. Phys. Lett. 50 (3); Jan. 19, 1987; pp. 130–131.

*Primary Examiner*—Mark Paschall

[57] ABSTRACT

The present invention provides methods of calibrating a deposition device, which is preferably a vapor deposition device, and more preferably is a physical vapor deposition device. One of the methods includes the steps of: (1) determining a resistance-temperature relationship of a substance located on a semiconductor wafer, a resistance of the substance being a function of a temperature of said semiconductor wafer; (2) placing the semiconductor wafer in the deposition device; (3) heating the heater to a known temperature; and (4) measuring a resistance of the substance, the resistance-temperature relationship allowing a relationship between a temperature of the semiconductor wafer and the known temperature to be determined, thereby to allow the deposition device to be calibrated.

25 Claims, 2 Drawing Sheets

SYSTEMS AND METHODS FOR DETERMINING SEMICONDUCTOR WAFER TEMPERATURE AND CALIBRATING A VAPOR DEPOSITION DEVICE

TECHNICAL FIELD OF THE INVENTION

The present invention is directed, in general, to semiconductor fabrication and, more specifically, to systems and methods for determining the temperature of a semiconductor wafer while in a deposition device and calibrating the deposition device in general.

BACKGROUND OF THE INVENTION

In the processing of semiconductor wafers, the wafers are frequently heated to elevated temperatures for processing in vacuum deposition devices, such as physical vapor deposition chambers. Thermal treatment of the wafers is sometimes a necessary or incidental component of a coating or etching process and at other times is the essence of the process itself, such as in rapid thermal processing, annealing or degassing. The temperature of the wafer is critical to producing a high quality, reliable wafer. If the temperature goes awry, either high or low, then the material or metal properties and microstructure of the interconnect changes, which has a direct impact on the reliability of the material or metal films that have been deposited, and in the worse case, it may result in a device failure.

In attempts to maintain control over the wafer temperature within the vacuum deposition device, various temperature schemes have been employed in these deposition devices. Thermocouples, for example, attached to or held in contact with the wafer, or mounted in the wafer support have been used. However, these devices are known to be slow to respond to temperature changes and often introduce a source of wafer contamination. Moreover, the wafers are usually moving in and out of the deposition device in a relatively short time frame, which can range from 10 seconds to 3 minutes. Attaching thermocouples directly to the wafer slows the transfer process, and thus the overall process, down to undesirable levels. Additionally, to maintain the vacuum required for high quality deposition of the materials, vacuum feed throughs for the thermocouples should be present. Thus, the equipment has to be modified with the vacuum feed throughs, which makes the process extremely cumbersome. Such direct thermocouple contact with the wafer can also require very long pump down times such that it takes hours to do one temperature measurement. Therefore, the process for periodically measuring wafer temperature becomes impracticable.

Pyrometers have also been employed to measure wafer temperature. While such pyrometer techniques avoid direct contact with the wafer being processed, they have the disadvantage of being sensitive to the emissivity of the material of which the wafer or coatings added to it are made; emissivity is also subject to change during processing.

Optical methods for indirectly measuring the temperature of an article by measuring its thermal expansion have also been used. These optical methods provide an advantage of being related only to the coefficient of thermal expansion of the material that forms a structural core of the wafer, which is constant and can be reliably determined. However, such optical methods also suffer from disadvantages. For example, some optical methods include the formation of images of the article that require equipment, such as optical sensors, to be placed close to the article where their accuracy can be affected by the process within the chamber. Such methods are in practice used off-line, and where so used, atmospheric refraction can also detract from the accuracy of the measurement process. Furthermore, where articles such as semiconductor wafers are mounted on a support within a sealed chamber for thermal processing, misalignment or distortion of the support may alter the wafer position and render optical temperature determination methods unreliable. Yet other optical methods involve specially designed equipment and methods to over come these problems, which is not completely desirable. The reason for this undesirability is that the specially designed equipment and methods associated with that equipment must be used, which precludes the use of conventional physical vapor deposition equipment and methods in the semiconductor wafer manufacturing process.

In addition, the deposition equipment manufacturer provides curves that relate heater block temperatures to the semiconductor wafer temperature. These curves, however, can be unreliable with respect to different deposition devices because each deposition device may vary with respect to another, thereby causing inaccuracies in the application of the standardized curves. Moreover, the physical properties of wafers may vary from one to another, which may also make cause additional inaccuracies in the application of the standardized curves.

Accordingly, what is needed in the art is a way of accurately determining the temperature of a semiconductor wafer while it is in a conventional deposition device and calibrating the device based on the temperature of the heater within the deposition device as it relates to the wafer temperature. The method of the present invention addresses these needs.

SUMMARY OF THE INVENTION

To address the above-discussed deficiencies of the prior art, the present invention provides methods of calibrating a deposition device, which is preferably a vapor deposition device, and more preferably is a physical vapor deposition device. One of the methods includes the steps of: (1) determining a resistance-temperature relationship of a substance located on a semiconductor wafer, a resistance of the substance being a function of a temperature of said semiconductor wafer; (2) placing the semiconductor wafer in the deposition device; (3) heating the heater to a known temperature; and (4) measuring a resistance of the substance, the resistance-temperature relationship allowing a relationship between a temperature of the semiconductor wafer and the known temperature to be determined, thereby to allow the deposition device to be calibrated.

The present invention therefore introduces the broad concept of providing a substance bearing an integral relationship with the semiconductor wafer that allows the temperature of the wafer to be determined. As stated above, vapor deposition devices that heat by convection exhibit a temperature differential between the heating element (or "block") and the wafer, which makes determination of the manufacturing wafer temperature less than accurate. As discussed above, an accurately known wafer temperature is crucial during the fabrication process to produce a high quality, reliable wafer. The present invention allows that differential to be determined accurately. If one knows the temperature of the substance (via the temperature-resistance relationship), one can know the differential and can therefore know at what temperature to set the heating element to produce a desired wafer temperature.

In a preferred embodiment, the substance is formed over a silicon dioxide film. The silicon dioxide film is preferably grown from the surface of the semiconductor wafer, however, it may be deposited by other known techniques, if desired. The silicon oxide film provides an electrically neutral layer between the substance and the semiconductor wafer. In a preferred embodiment, the substance is formed by depositing a titanium layer over the semiconductor wafer; depositing an aluminum layer over the titanium layer and reacting the aluminum layer with the titanium layer, which forms a titanium-aluminide layer when the semiconductor wafer is heated in the deposition device.

In one embodiment of the present invention, the step of heating the semiconductor wafer includes subjecting the semiconductor wafer to a hot inert gas, which, in preferred embodiments, is argon gas. The semiconductor wafer is preferably heated primarily by a convection process known as "back side argon gas heating". The heater within the deposition device heats the inert gas, which in turn heats the semiconductor wafer. It is from this convection heating process from which the previously discussed temperature differential between the heater and the semiconductor wafer arises.

In a preferred embodiment of the present invention, the semiconductor wafer is composed of silicon. It should, of course, be understood that the scope of the present invention certainly includes other presently known materials, such as gallium arsenide or later-determined materials that are or may be used to make such semiconductor devices.

In another embodiment of the present invention, the step of determining the resistance-temperature relationship includes the steps of determining a resistance for each of a plurality of known semiconductor wafer temperatures, thereby to obtain a resistance-semiconductor wafer temperature relationship. This embodiment further includes the step of determining a resistance for each of a plurality of known heater temperatures, thereby to obtain a resistance-heater temperature relationship. Another aspect of this particular embodiment preferably comprises the step of using the known heater temperature to determine a temperature of the semiconductor wafer from the resistance-semiconductor wafer temperature relationship and the resistance-heater temperature relationship.

In another embodiment of the present invention the method further comprises the step of heating the semiconductor wafer in a resistively heated furnace or a rapid thermal annealer to determine a known temperature of the semiconductor wafer and thereby determine the resistance-temperature relationship. Preferably, the temperature may be measured by a thermocouple attached directly to the wafer. However, other temperature measuring methods may also be used.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
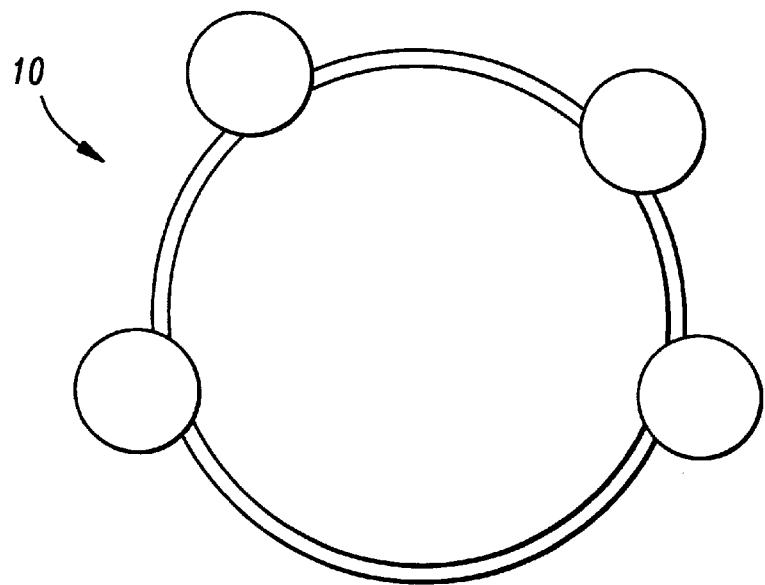
FIG. 1 illustrates a schematic representation of a conventional deposition device.

Referring initially to FIG. 1, there is illustrated a schematic representation of a conventional deposition device 10 used in the present invention. In a preferred embodiment, the deposition device 10 is a physical vapor deposition device in which a vacuum can be achieved and maintained, however, other deposition devices known to those skilled in the art may be used with the present invention. As is well known, such deposition devices are used to sputter various materials onto a semiconductor wafer. The vacuum is necessary to reduce environmental contaminants, which can affect the quality and reliability of the semiconductor wafer.

Figure 1A:
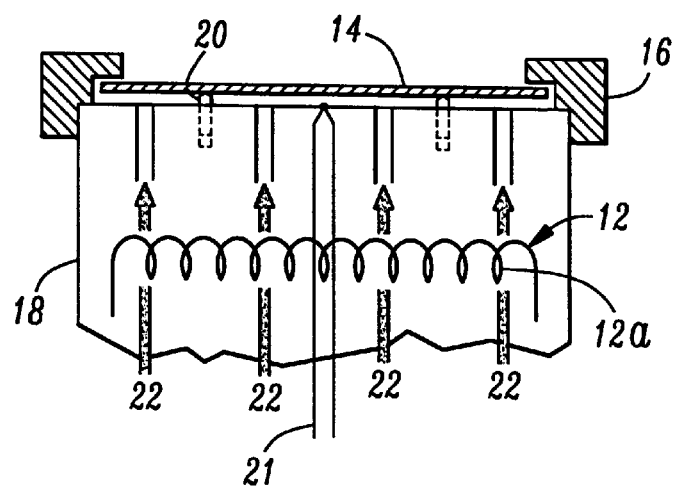
FIG. 1A illustrates a schematic representation of a heater block having a semiconductor positioned thereon.

Schematically represented in FIG. 1A, is a heater 12 contained within the deposition device 10. The heater 12 may be any type of apparatus capable of providing heat, but it is preferably a heating element with a resistive heating coil 12a that is capable of heating an inert gas, such as argon. A semiconductor wafer 14 is primarily heated by convection via heat transfer from the inert gas to the semiconductor wafer 14, although the semiconductor wafer 14 may also be partially heated by heat conduction from a clamp ring 16. Typically, the heater 12 is associated with a heater block 18, which may be comprised of stainless steel or copper. The heater block 18 also has pins 20 associated with it on which the semiconductor wafer 14 is placed. A robotic arm (not shown) brings the semiconductor wafer 14 into the deposition device 10 and positions it on the pins 20. The clamp ring 16, is then positioned around the semiconductor wafer 14, which secures it to the heater block 18.

During this phase of the fabrication process, the heater 12 heats an inert gas (shown by the arrow 22), which is preferably argon gas, as it is passed through the back side of the heater block 18. The temperature of the heater block 18 is measured by a thermocouple 21. When the sputtering process and all other fabrication steps are complete, the semiconductor wafer 14 is then removed from the deposition device 10. The indirect heating of the semiconductor wafer 14 causes a substantial temperature differential between the temperature of the heater block 18 and the semiconductor wafer 14. This temperature differential may range from 10° C. to 200° C., depending on the system configuration. As previously stated, if the semiconductor wafer's 14 temperature substantially deviates from normal manufacturing temperatures, the material or metal properties and microstructure of the wafer can change, which may have a direct impact on the reliability of the material or metal films that have been deposited, and in the worse case, it may result in a total device failure. Therefore, accurate semiconductor wafer temperature control is critical during the manufacturing process.

Figure 2:
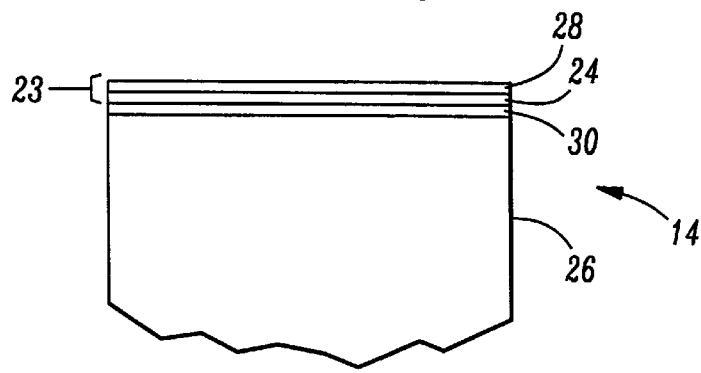
FIG. 2 illustrates a semiconductor wafer with a layer of titanium deposited over a silicon dioxide film and an aluminum film deposited over the titanium film.

In accordance with the present invention, accurate semiconductor wafer temperature control is achieved by calibrating the deposition device 10. In a preferred embodiment, the present invention includes the use of a substance 23 that is formed over an oxide layer 30, which in turn, is formed over the substrate of the semiconductor wafer 14. The substance 23 has physical properties wherein a resistance of the substance 23 is a function of the wafer's temperature. A preferred embodiment of this substance 23 is illustrated in FIG. 2. Preferably, the substance 23 is formed from a titanium layer 24 that is deposited at room temperature over the oxide layer 30 of the semiconductor wafer 14, and an aluminum layer 28 that is deposited at room temperature, over the titanium layer 24. However, in other embodiments, the substance 23 could include only the deposition of the substance itself without the need of forming the substance 23 from layers of differing materials as discussed with respect to the above-preferred embodiment. In the preferred embodiment, a standard physical vapor deposition device and conventional techniques are used to deposit the titanium and aluminum layers, 24,28. The titanium and aluminum layers 24,28 are deposited at room temperature to prevent any premature reaction from occurring between the titanium and aluminum. In preferred embodiments, the substrate 26 is silicon; however, other semiconductor materials known to those skilled in the art, such as gallium arsenide, may also be used.

Figure 3:
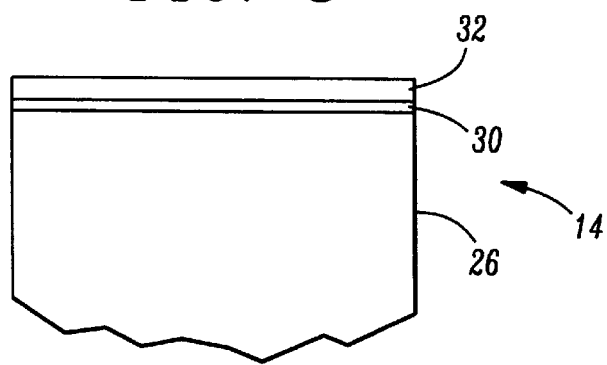
FIG. 3 illustrates the semiconductor wafer of FIG. 2 with the titanium and aluminum reacted to from a titanium-aluminide layer.

As mentioned above, the titanium layer 24 is preferably deposited over a dielectric oxide layer 30, such as silicon dioxide. The dielectric oxide layer 30, preferably has minimum thickness of about 100 nm. The oxide layer 30 is particularly desirable in those embodiments where the substrate 26 is comprised of silicon. The oxide layer 30 acts as a barrier to prevent the titanium in the titanium layer 24 from reacting with the silicon in the substrate 26 to form a silicide and also electrically isolates the substance 23 from the substrate 26. During the heating of the semiconductor wafer 14, the titanium layer 24 and aluminum layer 28 react to form a titanium-aluminide layer 32 ($Al_3Ti$) as illustrated in FIG. 3. The titanium-aluminide layer 32 has a final resistance "R" that is a function of the semiconductor wafer's 14 final temperature "T" reached in the deposition device 10. Some aspects of the titanium-aluminide film are disclosed in the following articles, which are incorporated herein by reference: R. K. Nahar, et al., Applied Physics Letters, Vol. 50, No. 3., pp. 130–131, (1987) and C. J. Krafscik, et al., Electrochemical Society, Extended Abstracts, Vol. 83-1, p. 681 (1983). While titanium-aluminide is discussed with respect to preferred embodiments, it should be understood that other materials presently known or later determined that possess the same resistance/temperature relationship exhibited by the titanium-aluminide may also be used.

Figure 4:
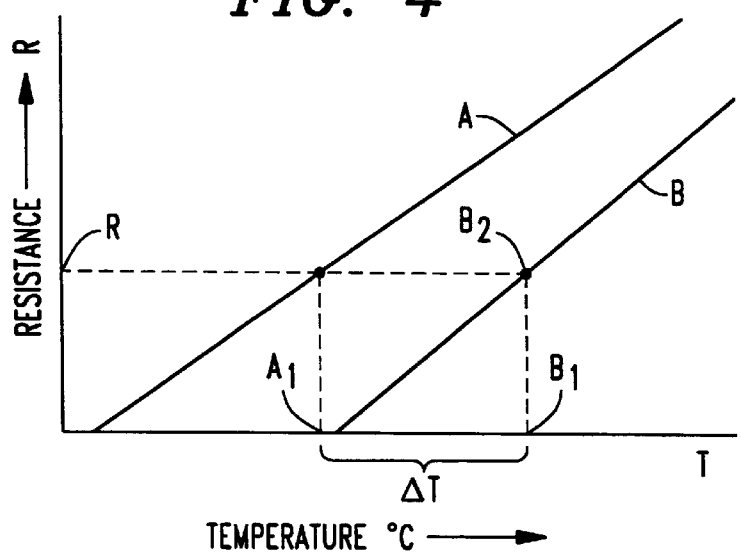
FIG. 4 illustrates schematic graphical representations of the temperature-resistance relationship between the resistance of the titanium-aluminide layer of FIG. 3 and the semiconductor wafer and the resistance-heater temperature relationship between the resistance of the titanium-aluminide layer of FIG. 3 and the known temperature of the heater within the deposition device.

To determine the resistance/wafer temperature relationship, the titanium and aluminum layers 24 and 28 are deposited on the semiconductor wafer substrate 26 over the dielectric oxide layer 30. Preferably, the semiconductor wafer 14 is then placed in a conventional rapid thermal annealer ("RTA"). The RTA is particularly useful in the present invention because, in such devices, a thermocouple contacts the semiconductor wafer 14 such that an accurate wafer temperature can be obtained. The thermocouple is brought into contact with the wafer, after which, the wafer is heated to a predetermined final temperature within temperatures ranges required to produce a high quality, reliable semiconductor wafer. After the predetermined temperature is reached, the wafer is then removed from the RTA, and the resistance of the substance is measured. In those embodiments that include the use of the titanium-aluminide, the wafer is allowed to set in the RTA for about 1 to 10 minutes to give the titanium and aluminum time to react and form the titanium-aluminide. When formed, the resistance of the titanium-aluminide, which is a function of the final temperature of the semiconductor wafer, is measured. This procedure is conducted for several wafers, each at a different temperature to obtain a data curve and for a period of time that is required to obtain the desired temperature. Each temperature is plotted as a function of the resistance obtained and measured for that particular temperature, from which curve "A" is obtained (see FIG. 4). Curve A in FIG. 4 is a representative example of a curve that could be obtained from the above-described procedure and does not represent actual data. The wafer resistance R is plotted along the Y-axis, and the wafer temperature T is plotted along the X-axis. The relationship may be linear as illustrated in FIG. 4, or it may be non-linear.

Once the resistance/wafer temperature curve is obtained, a resistance/heater block temperature curve is also obtained. A wafer is prepared in the same manner as described above, and in FIGS. 2 and 3, the wafer is placed in the preferred deposition device, i.e. a physical vapor deposition tool. The heater block is then set to a predetermined temperature of about 450° C., for example, which is measured by the thermocouple 23 (see FIG. 1A). The wafer is removed from the heater block and the resistance of the formed titanium-aluminide layer is measured. This same procedure is again repeated for several different wafers, each at a different temperature and for a period of time that is required to reach the desired temperature. The different heater block temperatures are plotted as a function of the measured resistance to obtain curve "B" in FIG. 4. It should be understood that while the example illustrated in FIG. 4 shows Curve A to the left of Curve B, Curve A could also be positioned to the right of Curve B, depending on the deposition tool being used. Again, the wafer resistance R is plotted along the Y-axis, and the wafer temperature T is plotted along the X-axis. As with the resistance/wafer temperature, the relationship may be non-linear, or it may be linear as illustrated in FIG. 4. After the resistance/wafer temperature curve A and the resistance/heater temperature curve B are obtained, the heater temperature can be related to a particular resistance, which in turn, can be related to an accurate semiconductor wafer temperature. For example, if the heater block temperature is $B_1$, thereby producing a resistance of $B_2$, the operator can correlate that to a wafer temperature $A_1$ at resistance $B_2$ by comparing curve A and B, as shown by the dotted lines in FIG. 4. A temperature differential $\Delta T$, which is the difference between the heater block temperature and the wafer temperature, can then be determined by the following equation: $\Delta T = B_1 - A_1$. Depending on the relative position of curve A to curve B as explained above, $\Delta T$ may be either a positive number or a negative number. Thus, the heater block temperature can be used to accurately determine the temperature of the wafer when the heater block is set at any given temperature. As such, the wafer temperature can be easily controlled to consistently produce a high quality, reliable semiconductor wafer. Due to the simplicity of the above-described procedure, the deposition device can be calibrated as often as is necessary to maintain high quality semiconductor wafer production.

From the foregoing, it is readily seen that the present invention provides methods of calibrating a deposition device, which is preferably a vapor deposition device, and more preferably is a physical vapor deposition device. One of the methods includes the steps of: (1) determining a resistance-temperature relationship of a substance located on a semiconductor wafer, a resistance of the substance being a function of a temperature of said semiconductor wafer; (2) placing the semiconductor wafer in the deposition device; (3) heating the heater to a known temperature; and (4) measuring a resistance of the substance, the resistance-temperature relationship allowing a relationship between a temperature of the semiconductor wafer and the known temperature to be determined, thereby to allow the deposition device to be calibrated.

The present invention therefore introduces the broad concept of providing a substance bearing an integral relationship with the semiconductor wafer that allows the temperature of the wafer to be determined. As stated above, vapor deposition devices that heat by convection exhibit a temperature differential between the heating element (or "block") and the wafer, which makes determination of the manufacturing wafer temperature less than accurate. As discussed above, a correct wafer temperature is crucial during the fabrication process to produce a high quality, reliable wafer. The present invention allows that differential to be determined accurately. If one knows the temperature of the substance (via the temperature-resistance relationship), one can know the differential and can therefore know at what temperature to set the heating element to produce a desired wafer temperature.

Although the present invention has been described in detail, those skilled in the art should understand that they can make various changes, substitutions and alterations herein without departing from the spirit and scope of the invention in its broadest form.

What is claimed is:

1. A method of determining a temperature relationship between a semiconductor wafer and a heater within a deposition device, comprising:

determining a resistance-temperature relationship of a substance located on said semiconductor wafer, a resistance of said substance being a function of a temperature of said semiconductor wafer;

placing said semiconductor wafer in said deposition device;

heating said heater to a known temperature;

measuring a resistance of said substance; and determining a resistance-temperature relationship between a temperature of said semiconductor wafer and said known temperature, a temperature of said semiconductor wafer determinable from said relationship when given a temperature of said heater.

2. The method as recited in claim 1 further comprising forming said substance over an oxide film.

3. The method as recited in claim 2 further comprising forming said substance by depositing a titanium layer over said semiconductor wafer; depositing an aluminum layer over said titanium layer and reacting said aluminum layer with said titanium layer.

4. The method as recited in claim 1 wherein said substance is titanium-aluminide.

5. The method as recited in claim 1 wherein said heating said semiconductor wafer includes subjecting said semiconductor wafer to a hot inert gas.

6. The method as recited in claim 1 wherein said semiconductor wafer is composed of silicon.

7. The method as recited in claim 1 wherein said deposition device is a physical vapor deposition device.

8. The method as recited in claim 1 wherein said determining said resistance-temperature relationship includes the steps of determining a resistance for each of a plurality of known semiconductor wafer temperatures, thereby to obtain a resistance-semiconductor wafer temperature relationship; and said method further comprising the determining a resistance for each of a plurality of known heater temperatures, thereby to obtain a resistance-heater temperature relationship.

9. The method as recited in claim 8 further comprising using said known heater temperature to determine a temperature of said semiconductor wafer from said resistance-semiconductor wafer temperature relationship and said resistance-heater temperature relationship.

10. The method as recited in claim 1 further comprising heating said semiconductor wafer in a resistively heated furnace to determine a known temperature of said semiconductor wafer and thereby determine said resistance-temperature relationship.

11. The method as recited in claim 1 further comprising heating said semiconductor wafer in a rapid thermal annealer to determine a known temperature of said semiconductor wafer and thereby determine said resistance-temperature relationship.

12. A method of determining a temperature relationship between a semiconductor wafer and a heater within a deposition device, comprising:

forming a layer of a substance having a temperature-dependent electrical resistance on a semiconductor wafer;

determining a resistance-temperature relationship of said layer, a resistance of said layer being a function of a temperature of said semiconductor wafer;

placing said semiconductor wafer in said deposition device;

heating said heater to a known temperature; and measuring a resistance of said layer, said resistance-temperature relationship allowing a relationship between a temperature of said semiconductor wafer and said known temperature to be determined, thereby to allow said temperature of said semiconductor wafer to be determined from said relationship when given a temperature of said heater.

13. The method as recited in claim 12 wherein said forming includes forming said layer over a silicon dioxide film.

14. The method as recited in claim 13 wherein said forming said layer includes depositing a titanium layer over said semiconductor wafer; depositing an aluminum layer over said titanium layer and reacting said aluminum layer with said titanium layer.

15. The method as recited in claim 12 wherein said layer is titanium-aluminide layer.

16. The method as recited in claim 12 wherein said heating said semiconductor wafer includes subjecting said semiconductor wafer to a hot inert gas.

17. The method as recited in claim 12 wherein said semiconductor wafer is composed of silicon.

18. The method as recited in claim 12 wherein said deposition device is a physical vapor deposition device.

19. The method as recited in claim 12 wherein said determining said resistance-temperature relationship includes the steps of determining a resistance for each of a plurality of known semiconductor wafer temperatures, thereby to obtain a resistance-semiconductor wafer temperature relationship; and said method further comprising the determining a resistance for each of a plurality of known heater temperatures, thereby to obtain a resistance-heater temperature relationship.

20. The method as recited in claim 19 further comprising the using said known heater temperature to determine a temperature of said semiconductor wafer from said resistance-semiconductor wafer temperature relationship and said resistance-heater temperature relationship.

21. A method of determining a temperature relationship between a semiconductor wafer and a heater within a physical vapor deposition device, comprising:

forming a layer of titanium-aluminide over a silicon dioxide layer on a semiconductor wafer;

determining a resistance for each of a plurality of known semiconductor wafer temperatures, thereby to obtain a resistance-semiconductor wafer temperature relationship;

determining a resistance for each of a plurality of known heater temperatures, thereby to obtain a resistance-heater temperature relationship;

placing said semiconductor wafer in said deposition device;

heating said heater to a known temperature; and using one of said plurality of known heater temperatures to determine a temperature of said semiconductor wafer from said resistance-semiconductor wafer temperature relationship and said resistance-heater temperature relationship.

22. The method as recited in claim 21 wherein said heating said semiconductor wafer by exposing said semiconductor wafer to a hot inert gas.

23. The method as recited in claim 21 wherein said semiconductor wafer is composed of silicon.

24. The method as recited in claim 21 wherein said determining said resistance for each of a plurality of known semiconductor wafer temperatures further comprises the step of heating said semiconductor wafer in a resistively heated furnace to determine said known semiconductor wafer temperatures.

25. The method as recited in claim 21 wherein said determining said resistance for each of a plurality of known semiconductor wafer temperatures further comprises the step of heating said semiconductor wafer in a rapid thermal annealer to determine said known semiconductor wafer temperatures.

* * * * *